(12) United States Patent
Chen et al.

(10) Patent No.: US 8,096,822 B2
(45) Date of Patent: Jan. 17, 2012

(54) IC SOCKET HAVING RESTRAINING MECHANISM

(75) Inventors: Ke-Hao Chen, Tu-cheng (TW); Wen-Yi Hsieh, Tu-cheng (TW); Ming-Yue Chen, Tu-cheng (TW)

(73) Assignee: Hon Hai Precision Ind. Co., Ltd, New Taipei (TW)

( * ) Notice: Subject to any disclaimer, the term of this patent is extended or adjusted under 35 U.S.C. 154(b) by 0 days.

(21) Appl. No.: 12/804,846

(22) Filed: Jul. 30, 2010

(65) Prior Publication Data
US 2011/0028009 A1    Feb. 3, 2011

(30) Foreign Application Priority Data
Jul. 30, 2009    (TW) .............................. 98213944 U

(51) Int. Cl.
*H01R 13/62*    (2006.01)
(52) U.S. Cl. ........................................................ 439/330
(58) Field of Classification Search ................ 439/140, 439/65–66, 268, 68, 135, 152, 330–331, 439/70–73
See application file for complete search history.

(56) References Cited

U.S. PATENT DOCUMENTS

| 3,271,530 | A | * | 9/1966 | Wirsching | .................... | 200/5 C |
| 6,162,066 | A | * | 12/2000 | Glick et al. | ..................... | 439/73 |
| 6,984,142 | B2 | * | 1/2006 | Shimizu | ........................ | 439/268 |
| 7,491,082 | B2 | * | 2/2009 | Hsu et al. | ...................... | 439/330 |
| 7,869,171 | B2 | * | 1/2011 | Weeks et al. | .................... | 361/42 |
| 2002/0056300 | A1 | * | 5/2002 | Pierre et al. | ................. | 70/303 A |
| 2008/0057765 | A1 | * | 3/2008 | Hsiao et al. | ................... | 439/259 |

* cited by examiner

*Primary Examiner* — Jean F Duverne
(74) *Attorney, Agent, or Firm* — Wei Te Chung; Andrew C. Cheng; Ming Chieh Chang

(57) ABSTRACT

An IC socket includes a base receiving a number of contacts, a lid mounted upon the base, and at least one latch mounted in the base. The lid is able to be operated between a first position away from the base and a second position adjacent to the base. The latch is driven by the lid to open and close. At least one stopper is disposed on the lid and extends into a recess defined on the latch to lock with latch the latch when the lid located at the first position for preventing the lid from dropping from the base.

11 Claims, 9 Drawing Sheets

US 8,096,822 B2

IC SOCKET HAVING RESTRAINING MECHANISM

BACKGROUND OF THE INVENTION

1. Field of the Invention

The present invention relates to an integrated circuit (IC) socket, and more particularly to an IC socket having a lid provided with a restraining mechanism to prevent the lid from jumping out of the IC socket so as to ensure a well operation of the IC socket.

2. Description of Related Art

Electronic package is installed on a printed circuit board to construct a complete circuit of continuous function. To ensure the security and reliability of the electronic package during using, the electronic package must be tested before using. The test usually undergoes extended period of time at high temperature so that a defective package can be detected earlier. A so-called burn-in socket servers this purpose. The burn-in socket typically comprises a base, a plurality of contacts disposed on the base, latches and a lid for driving the latches to open and close relative to the base. Four clasps provided by the lid engage with outer walls of the base to define a largest distance for the lid upwardly moving. Four springs are mounted at corners of the base to push the lid to move upwardly and close the latches synchronously. The lid is pressed downwardly by fingers of an operator, sometime only one side of the lid is pressed, then another opposite side of the lid may cock and even released the clasps from the base, at this situation, if the operator takes his finger back suddenly, the restored force of the springs will eject the lid from the base, that will damage the IC socket and hurt the operator.

Therefore, an improved IC socket is needed.

SUMMARY OF THE INVENTION

An object of the present invention is to provide an IC socket having an lid provided with a restraining mechanism to prevent the lid from jumping out of the IC socket.

To achieve the aforementioned object, an IC socket made in accordance with the present invention comprises a base receiving a plurality of contacts, an lid mounted upon the base, and at least one latch mounted in the base. The lid is able to be operated between a first position away from the base and a second position adjacent to the base. The latch is driven by the lid to open and close and defines a recess. At least one stopper is disposed on the lid and received in the recess when the lid is located at the first position to prevent the lid from removing from the base.

To further achieve the aforementioned object, an IC socket made in accordance with the present invention comprises a base with a plurality of contacts, an lid mounted to the base, and at least two latches mounted to the base. The lid moves in a vertical direction and has at least one pusher and one stopper. Each latch has a guiding portion pushed by the pusher to open and close and a wall abutting against the stopper in the vertical direction to restrict the lid to the base.

Other objects, advantages and novel features of the invention will become more apparent from the following detailed description of a preferred embodiment when taken in conjunction with the accompanying drawings.

DETAILED DESCRIPTION OF THE INVENTION

Figure 1:
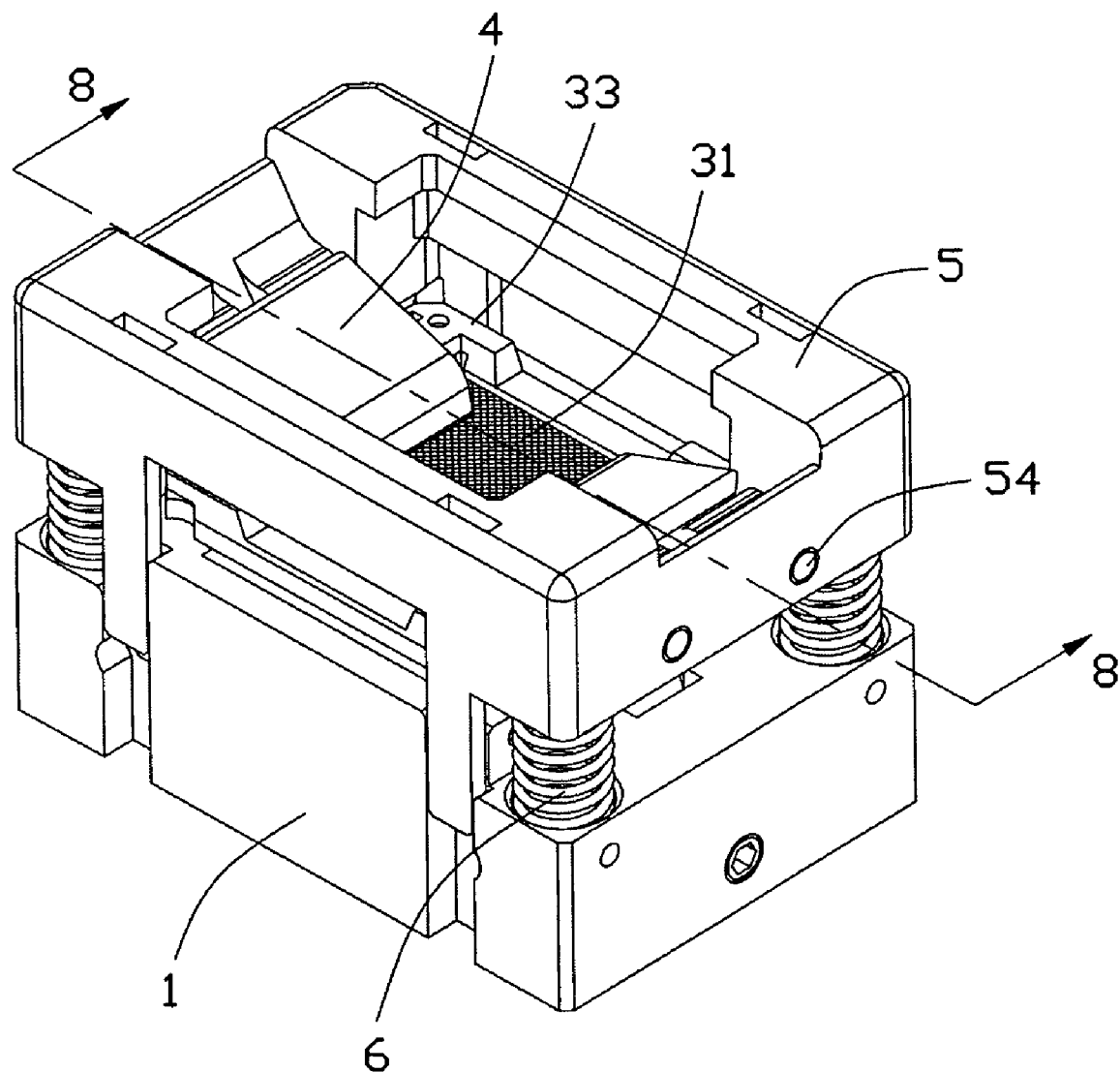
FIG. 1 is an assembly perspective view of an IC socket in accordance with the present invention.
Figure 2:
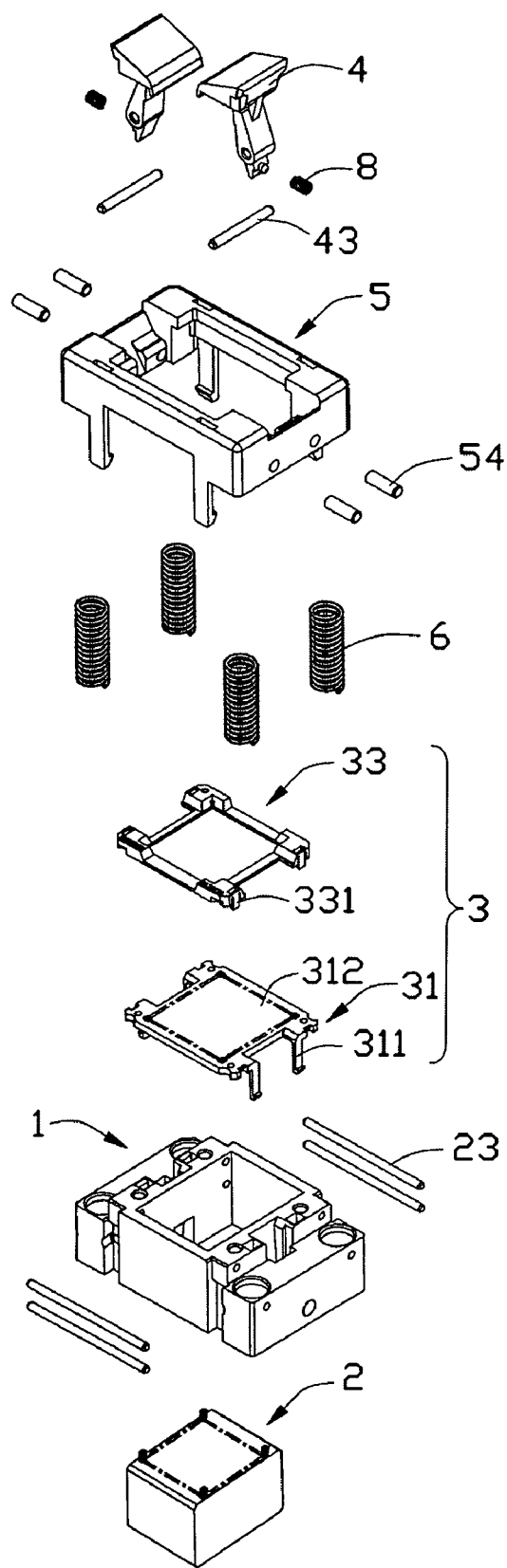
FIG. 2 is an explode perspective view of the IC socket of FIG. 1.

FIGS. 1 and 2 show an IC socket used for testing an electronic package (not shown). The socket comprises a base 1, a contact module 2 mounted in the base 1, a sliding member 3 mounted upon the base 1, a pair of latches 4 assembled to opposite sides of the base 1, and a lid 5 assembled to the base 1 and moveable in a vertical direction.

Figure 3:
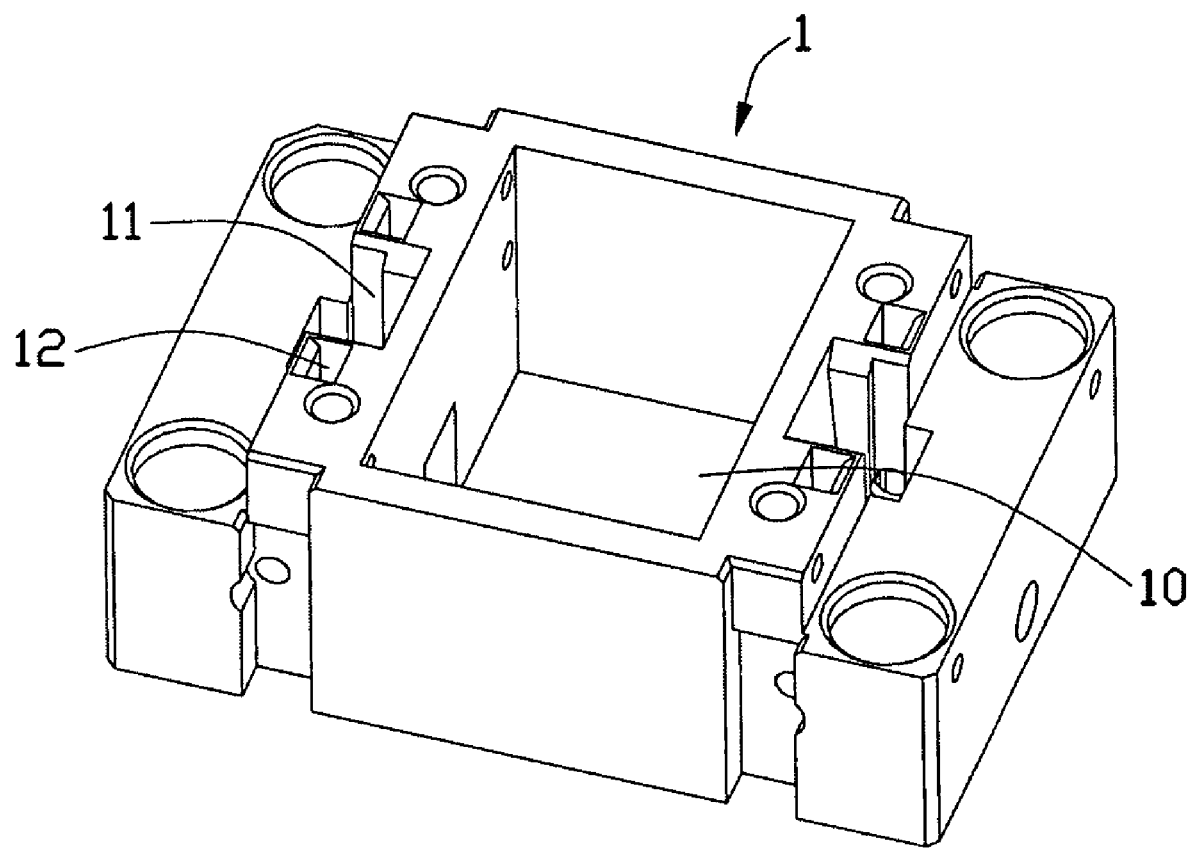
FIG. 3 is a perspective view of a base of the IC socket in accordance with the present invention.

Referring to FIG. 3, the base 1 is substantially rectangular and has an opening 10 extending substantially vertically through the base 1. A pair of cavity 11 are defined adjacent the opening 10 and located at opposite sides of the base 1 for receiving the latches 4. A plurality of springs 6 are located at four corners of the base 1 to provide flexible force for the lid 5. The base 1 further includes a plurality of apertures 12 to retain the sliding plate 3.

Figure 4:
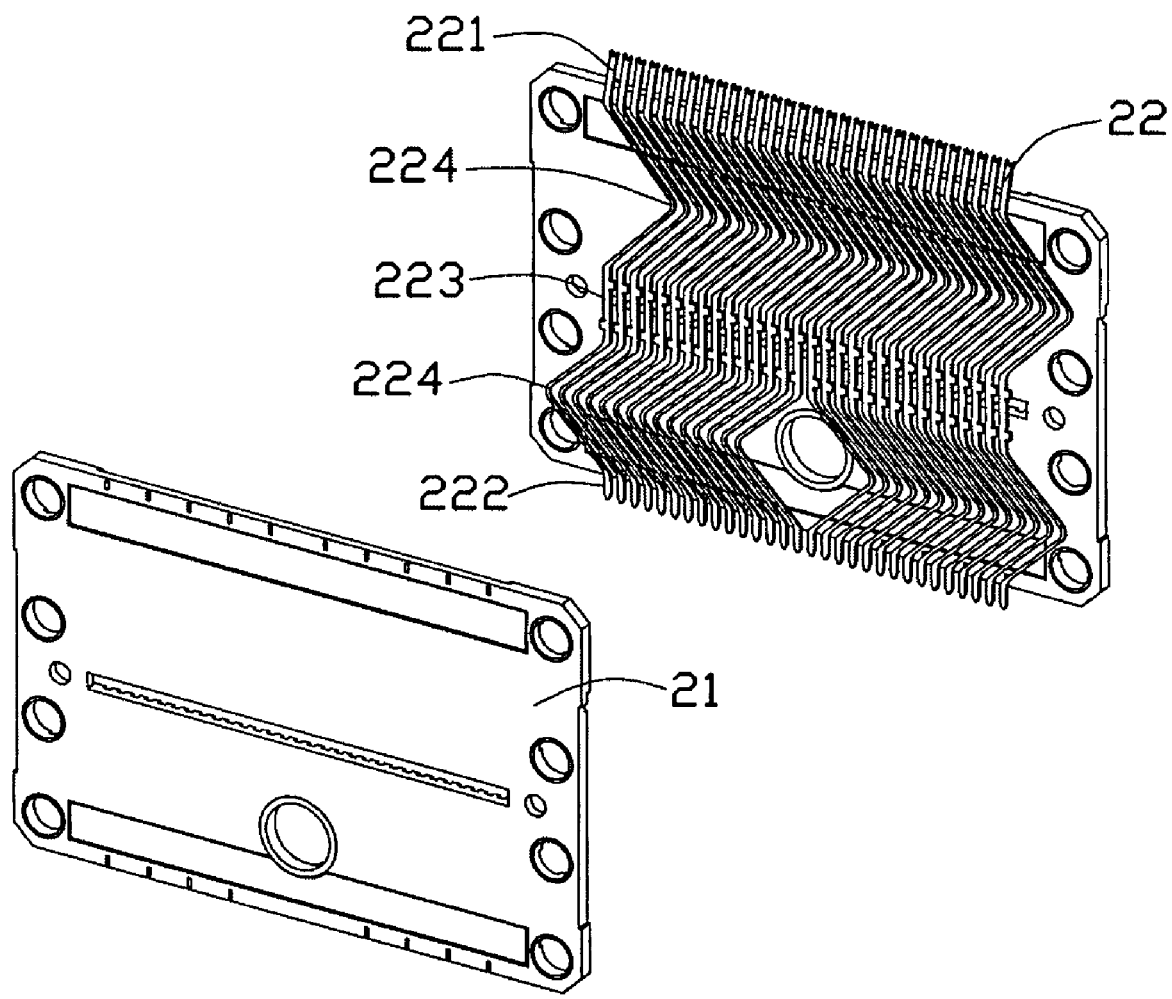
FIG. 4 is an explode perspective view of a part of a contact module of the IC socket in accordance with the present invention.

Referring to FIGS. 2 and 4, the contact module 2 is mounted in the opening 10 of the base 1 by a shaft 23 and includes a plurality of board-like plates 21 against with each other, a plurality contacts 22 sandwiched at two adjacent plates 21. Each contact 22 is configured in a bent shape and comprises a mating portion 221 contacting with the electronic package (not shown), a tail 222 engaging with a printed circuit board (not shown), and a retention portion 223 and two curved portions 224 positioned between the mating portion 221 and the tail 222. One of the curved portion 224 links the retention portion 223 and the mating portion 221, and the other curved portion 224 links the retention portion 223 and the tail 222. When the contacts 22 are assembled in the plates 21, the mating portions 221 and the tails 222 extend beyond a top and a bottom sides of the plates 21, respectively.

Referring to FIGS. 2 and 3, the sliding member 3 includes a sliding plate 31 used for supporting the electronic package (not shown) and orientating solder balls (not shown) of the electronic package (not shown), and a frame 33 mounted upon the sliding plate 31 for orientating the electronic package (not shown). The sliding plate 31 has a substantially rectangular shape and a plurality of passageways 312 extending through thereof to receive the contacts 22. The mating portions 221 of the contacts 22 and the solder balls (not shown) of the electronic package (not shown) are both received in the passageways 312 to construct an electrical connection thereof. A plurality of hooks 311 extend downwardly from opposite sides of the sliding plate 31 to engage with the apertures 12 of the base 1 to moveably secure the sliding plate 31 to the base 1. A plurality of springs (not shown) are located between the siding plate 31 and base 1 for supporting the sliding member 3 moveable with respect to the base 1 in a vertical direction. The frame 33 provided with a plurality snaps 331 is fixed to the sliding plate 31 such that the frame 33 and sliding plate 31 can move together with respect to the base 1.

Figure 5:
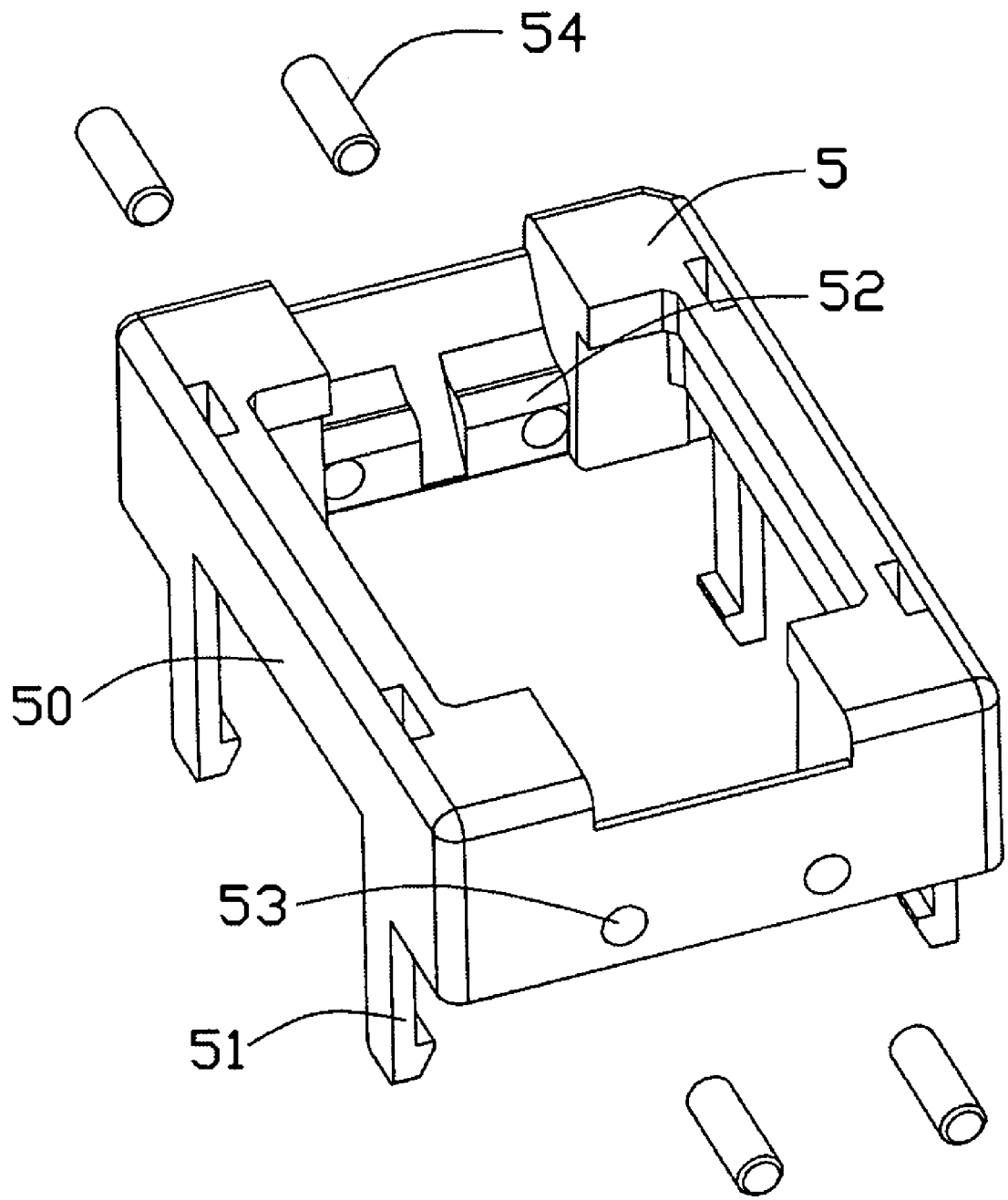
FIG. 5 is a perspective view of a lid of the IC socket in accordance with a first embodiment.
Figure 6:
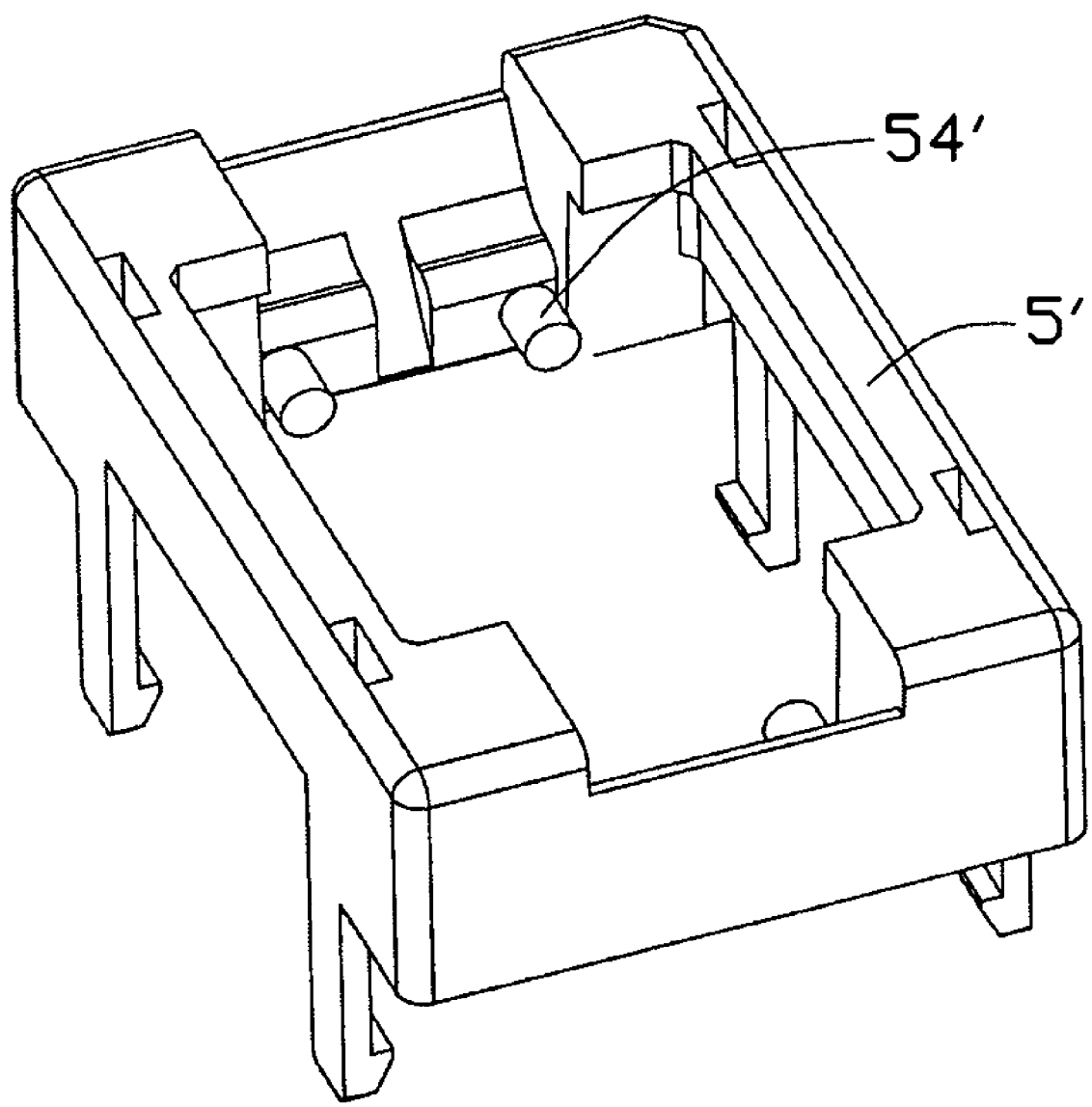
FIG. 6 is a perspective view of a lid of the IC socket in accordance with a second embodiment.

The lid 5 has a rectangular frame configuration and is surrounded by four side walls 50. The lid 5 can move between a first position far away the base 1 and a second position adjacent to the base 1. A pair of longitudinal side walls 50 have four clasps 51 extending downwardly to engage with outer walls of the base 1 so as to define a largest distance for the lid 5 upwardly moving. A plurality of pusher 52 with curved surfaces protrude from a pair of traversal side walls 50 of the lid 5 to push the latches 4 to open and close with regard to the base 1. A plurality of stoppers 54 are disposed on the pusher 52 of the side walls 50 and extend into an inner space of the frame-liked lid 5. Referring to FIG. 5, it shows the first embodiment of the lid 5, in the first embodiment, four holes 53 are defined on and extend through the pushers 52 of the traversal side walls 50, and four stoppers 54 configured with metallic rods insert into the holes 53. FIG. 6 shows a second embodiment of the lid 5', the stoppers 54' are integrally formed with the lid 5' and no holes are defined.

Figure 7:
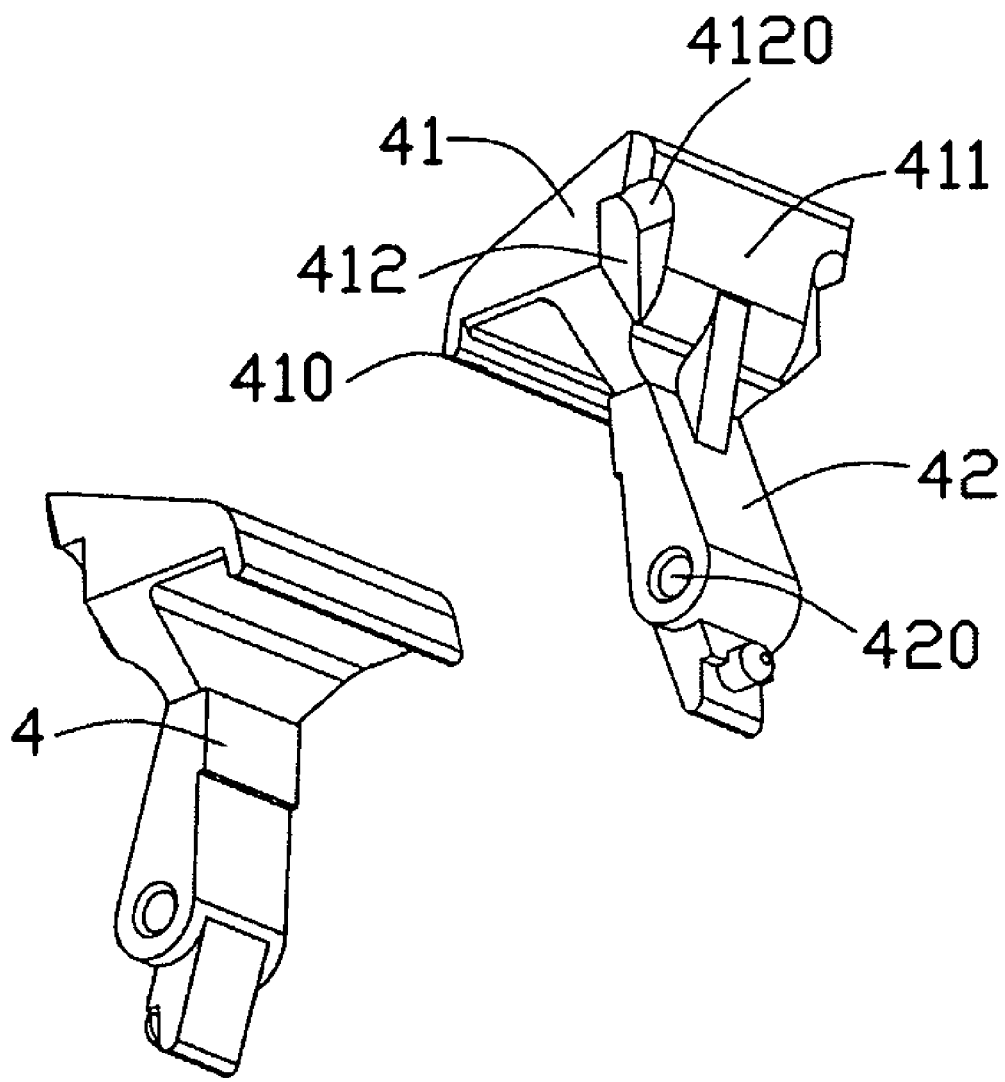
FIG. 7 is a perspective view of a pair of latches of the IC socket in accordance with the present invention.

Referring to FIGS. 2 and 7, the latches 4 is configured with a lateral top section 41 and a longitudinal bottom section 42. A pressing portion 410 is formed at front end of the top section 41, adapted for pressing the electronic package (not shown). A guiding portion 411 with an inclined surface is formed at rear end of the top section 41 and is pushed by the pusher 52 so that the latch 4 can be rotated to open and close. A pair of recesses 412 are defined on two opposite sides of the guiding portion 411 with a top wall 4120 to limit the stopper 54 when the lid 5 is located at the first position (see FIG. 8). A through hole 420 extends through side surfaces of the bottom section 42 of the latch 4, and an axis 43 passes through the through hole 420 to secure the latch 4 to the base 1. The latch 4 rotates around to the axis 43. A spring 8 is horizontally disposed in the base 1 and perpendicular to the axis 43 to provide a spring force to open the latch 4.

Figure 8:
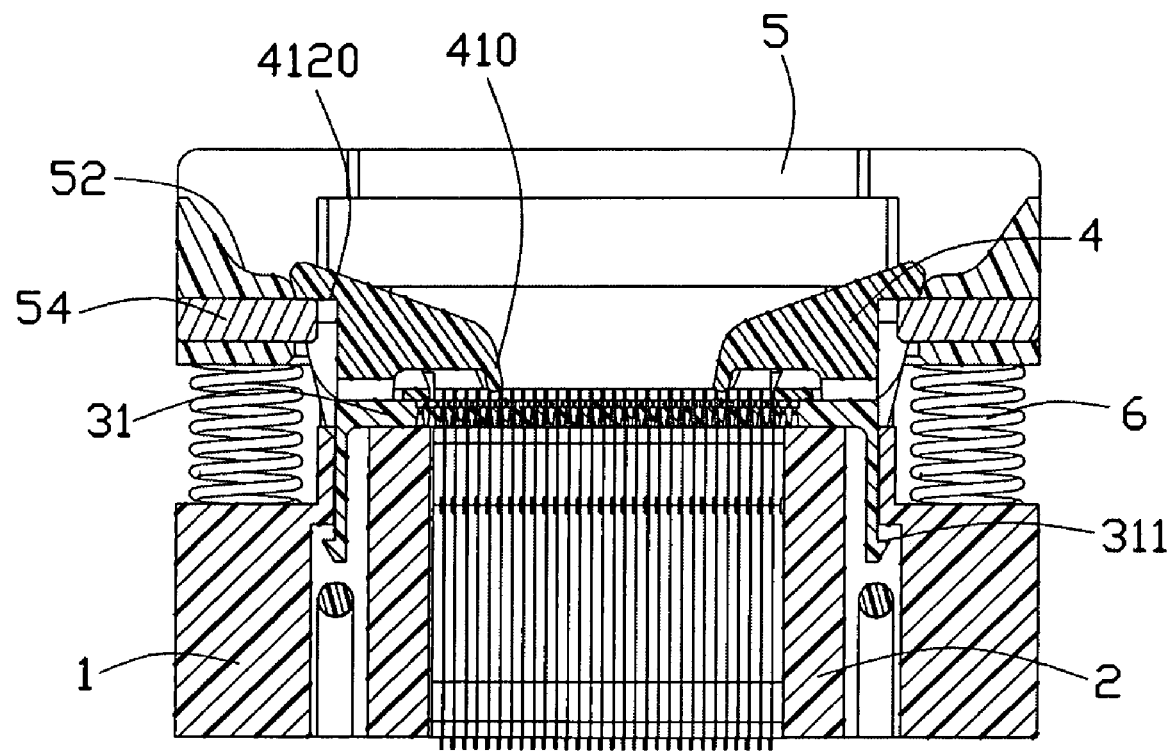
FIG. 8 is a cross-section view taken along line 8-8 of FIG. 1, showing the lid located at a first position.
Figure 9:
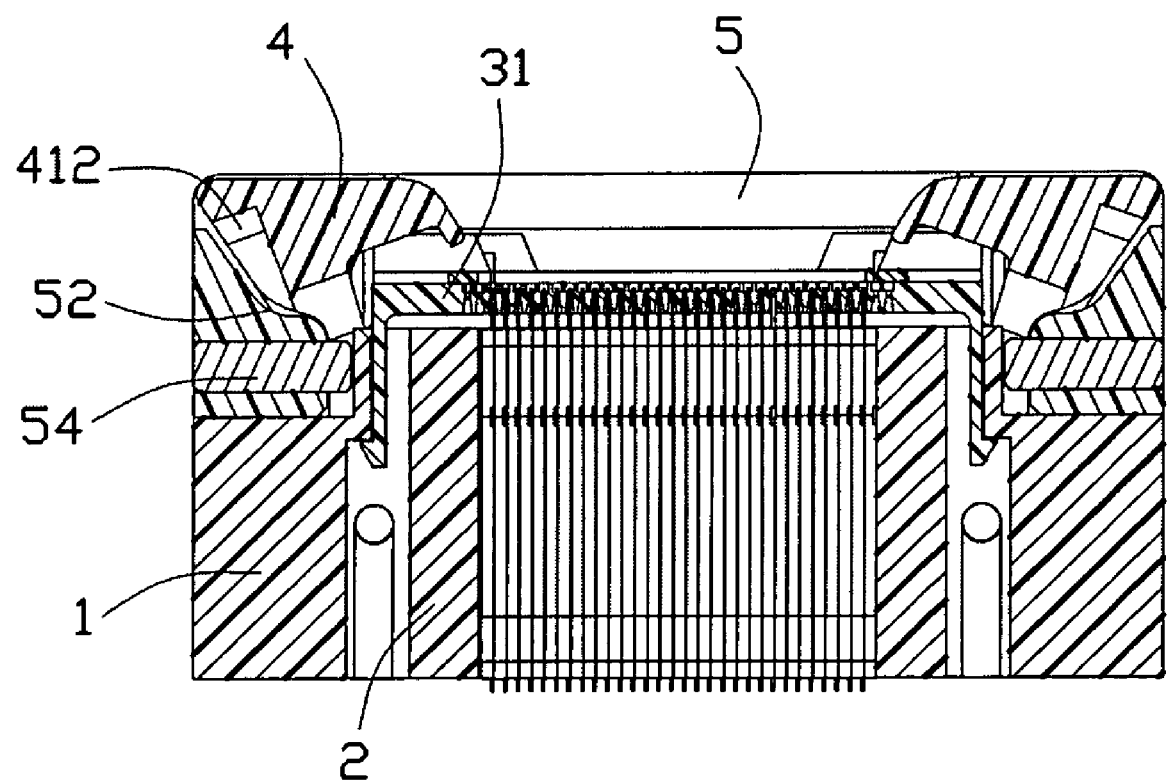
FIG. 9 is similar to FIG. 8, showing the lid located at a second position.

FIG. 8 is a cross-sectional view of the lid 5 located in the first position, and FIG. 9 is a cross-sectional view of the lid 5 located in the second position. Referring to FIG. 8, in order to put the electronic package (not shown) in to the IC socket, the lid 5 is pressed downwardly by an outside force exerting thereon, and meanwhile the latches 4 rotates to open by the spring force of the springs 8. At this situation, the lid 5 is located at the second position as shown in FIG. 9 and the electronic package (not shown) is put in the frame 33. After that, releasing the lid 5, the lid 5 returns to the first position by the springs 6 and the latches 4 are closed with respect to the base 1 by the pushers 52 of the lid 5. The latches 4 press on the electronic package (not shown) to bring the sliding plate 31 and frame 33 to downwardly move, and the contacts 22 are also pressed to be lower than the initial heights so as to construct a reliable electrical connection between the contacts 22 and the electronic package. When the lid 5 returns to the first position, the stoppers 54 abuts against the top wall 4120 of the recess 412 and the clasp 51 engage with the base 1 to prevent the lid 5 from jumping out of the base 1. In that case, the lid 5 is ensured located in the IC socket even one edge thereof is pressed.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:
1. An IC socket comprising:
a base receiving a plurality of contacts;
a lid mounted upon the base and being able to be operated between a first position away from the base and a second position adjacent to the base;
at least one latch mounted in the base and driven by the lid to open and close and defining a recess; and
at least one stopper disposed on the lid and received in the recess when the lid is located at the first position to prevent the lid from removing from the base; wherein the contacts are sandwich by a plurality of plates, and each contact comprises a mating portion extending beyond a top edge of the plate, a tail extending beyond a bottom edge of the plate, and a retention portion and two curved portions positioned between the mating portion and the tail; wherein one of the two curved portion links the retention portion and the mating portion and the other curved portion links the retention portion and the tail.

2. The IC socket as claimed in claim 1, wherein the recess has a top wall to limit the stopper to upwardly move at the first position.

3. The IC socket as claimed in claim 2, wherein the stopper is a metallic rod mounted to a hole defined on the lid.

4. The IC socket as claimed in claim 2, wherein the stopper is integrally formed with the lid.

5. The IC socket as claimed in claim 1, wherein the latch comprises a lateral top section rotating with respect to the base and a longitudinal bottom section for securing the latch to the base.

6. The IC socket as claimed in claim 5, wherein a pressing portion is formed at front end of the top section, and a guiding portion with an inclined surface is formed at rear end of the top section.

7. The IC socket as claimed in claim 6, wherein the bottom section has a through hole, and an axis passes through the through hole to secure the latch to the base.

8. The IC socket as claimed in claim 6, wherein a plurality of pushers protrude from the lid to push the guiding portions of the latches, and the stopper is disposed on the pusher.

9. The IC socket as claimed in claim 1, further comprising a sliding member moveable in a vertical direction, the sliding member includes a sliding plate and a frame fixed upon the sliding plate.

10. An IC socket comprising:
a base;
a plurality of contacts located within the base;
a lid mounted upon the base and up and down moveable between upper and lower positions relative to the base in a vertical direction, said lid defining an upward curved section and a stopper with an upward abutment face thereon; and
a latch pivotally mounted upon the base and rotationally driven by the lid between outer open and inner closed positions, said latch defining a downward curved section and a downward abutment face; wherein
the upward curved section of the lid abuts against the downward curved section of the latch during rotation of the latch, and the upward abutment face of the lid abuts against the downward abutment face of the latch in a vertical direction when the latch is located at the inner closed position; wherein said downward abutment face is formed in a recess of the latch; wherein said upward abutment is located inwardly relative to the upward curved section.

11. The IC socket as claimed in claim 10, wherein said upward abutment is located below the upward curved section.

* * * * *